United States Patent
Hirano et al.

(10) Patent No.: US 6,699,758 B2
(45) Date of Patent: Mar. 2, 2004

(54) SEMICONDUCTOR DEVICE AND METHOD FOR MANUFACTURING THE SAME

(75) Inventors: Yuuichi Hirano, Tokyo (JP); Yasuo Yamaguchi, Tokyo (JP); Shigeto Maegawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/983,164

(22) Filed: Oct. 23, 2001

(65) Prior Publication Data

US 2002/0020876 A1 Feb. 21, 2002

Related U.S. Application Data

(62) Division of application No. 09/173,616, filed on Oct. 16, 1998, now Pat. No. 6,340,829.

(30) Foreign Application Priority Data

May 6, 1998 (JP) .......................................... 10-123303

(51) Int. Cl.[7] .......................................... H01L 21/8234
(52) U.S. Cl. ..................................................... 438/275
(58) Field of Search ................................ 438/197, 153, 438/154, 156, 217, 258, 275, 276, 279, 289, 292; 257/347, 382, 384, 389

(56) References Cited

U.S. PATENT DOCUMENTS

| | | | |
|---|---|---|---|
| 4,905,066 A | 2/1990 | Dohjo et al. | |
| 5,151,376 A | 9/1992 | Spinner, III | |
| 5,258,645 A | 11/1993 | Sato | |
| 5,323,047 A * | 6/1994 | Nguyen | 257/384 |
| 5,424,570 A * | 6/1995 | Sardella et al. | 257/333 |
| 5,428,240 A * | 6/1995 | Lur | 257/389 |
| 5,468,986 A * | 11/1995 | Yamanashi | 257/389 |
| 5,576,556 A | 11/1996 | Takemura et al. | |
| 5,719,065 A | 2/1998 | Takemura et al. | |
| 5,945,711 A | 8/1999 | Takemura et al. | |
| 6,008,077 A * | 12/1999 | Maeda | 438/151 |
| 6,136,647 A * | 10/2000 | Sung | 438/257 |
| 6,309,948 B1 * | 10/2001 | Lin et al. | 438/424 |

FOREIGN PATENT DOCUMENTS

| | | |
|---|---|---|
| EP | 0 905 773 A2 | 3/1999 |
| JP | 64-20663 | 1/1999 |

OTHER PUBLICATIONS

Patent Abstract of Japan, vol. 013, No. 166 (E–746), Apr. 20, 1989 and JP 63 318779A (Sanyo Electric Co., LTD.), Dec. 27, 1988.

* cited by examiner

*Primary Examiner*—Olik Chaudhuri
*Assistant Examiner*—Brook Kebede
(74) *Attorney, Agent, or Firm*—Oblon, Spivak, McClelland, Maier & Neustadt, P.C.

(57) ABSTRACT

The first insulating film (81) and the second insulating film (82) are so layered in this order on a SOI layer (3) as to cover a gate electrode (6) and a side wall (5) and dry-etched with different etching selection ratio (the etching rate of the second insulating film (82) is smaller). After that, an exposed portion of the first insulating film (81) is removed by wet etching. Through these steps, a silicide protection portion (8) is formed only on a flat surface (3S) of the SOI layer (3) and silicide layers (71 and 72) are formed in $n^+$ layers (12 and 13). With this structure, it is possible to prevent etching of the SOI layer in formation of an $SiO_2$ film for silicide protection.

4 Claims, 14 Drawing Sheets

US 6,699,758 B2

SEMICONDUCTOR DEVICE AND METHOD FOR MANUFACTURING THE SAME

This is a Divisional of application Ser. No. 09/173,616 filed Oct. 16, 1998, now U.S. Pat. No. 6,340,829.

BACKGROUND OF THE INVENTION

1. Field of the Invention

The present invention relates to a semiconductor device and a method for manufacturing the same, and more particularly to a technique for improvement in characteristics of an input protection circuit in an LSI.

2. Description of the Background Art

In a MOSFET, a well-known method for effectively enhancing a proof stress against variation in voltage amplitude of an input signal which is applied to a source/drain region is formation of a silicide protection. This method is, for example, to form an $SiO_2$ film over a gate electrode and side walls and then forming silicide on a surface portion of an $n^+$-type layer uncovered with the $SiO_2$ film as shown in FIG. 33, thereby raising a resistance of the source/drain region near the gate electrode without forming silicide on the region.

In a MOS structure using SOI (Silicon On Insulator), however, since the SOI layer is very thin (e.g., its thickness is about 1000 Å), the SOI layer is etched in an etching to form the $SiO_2$ film for silicide protection. If the SOI layer is etched, too, part of the SOI layer becomes thin because of level difference and the silicide layer which should originally extend from a surface of the SOI layer to the inside thereof reaches an interface between the SOI layer and a buried oxide film, to disadvantageously cause a leakage current and remove the silicide film.

This will be discussed below with reference to cross-sectional step views of FIGS. 29 to 35.

In order to avoid silicification of the source/drain region near the gate electrode by covering the region with the $SiO_2$ film, usually, a series of steps shown in FIGS. 29 to 33 are carried out. Specifically, a gate electrode and source/drain regions are formed as shown in FIG. 29, and an $SiO_2$ film is deposited as shown in FIG. 30. Next, a resist is formed on a portion of the $SiO_2$ film which is to serve as the silicide protection portion as shown in FIG. 31, and a dry etching is performed to form an $SiO_2$ film to serve as the silicide protection portion. After that, the unnecessary resist is removed. Then, a silicide layer is formed as shown in FIG. 34.

Since the Si layer as the SOI layer is very thin, about 1000 Å, the Si layer is also etched in the dry etching and as a result a level difference as shown in FIG. 34 is created locally in a surface of the Si layer. In this condition, when silicide is formed on a prescribed uncovered portion of the source/drain region, the buried oxide film and a silicide layer come into contact as shown in FIG. 35. Since the silicide layer weakly adheres to the buried oxide film in this condition, there is a possibility that the silicide layer may be removed depending on the strength of thermal stress applied in later steps. Further, even if the silicide layer is not removed, a leakage current may be produced between two silicide layers through the buried oxide film, and therefore there may arise an appreciable influence on characteristics of a transistor such as malfunction in a transistor operation.

Regarding this point, Japanese Patent Application Laid Open Gazette 64-20663 discloses that in a dry etching for forming a side wall of a gate electrode of a MOS transistor, an $Si_3N_4$ film is formed as an etching stopper film in advance on a surface of a semiconductor layer to cover both sides of the gate electrode and a gate insulating film and then a side wall is so formed as to cover the $Si_3N_4$ film. This prior art, however, which essentially suggests a side wall of double-layered structure consisting of the $Si_3N_4$ film and the $SiO_2$ film, can not be an effective solution of the above problem.

SUMMARY OF THE INVENTION

The present invention is directed to a semiconductor device. According to a first aspect of the present invention, the semiconductor device comprises: an underlying layer; a semiconductor layer provided on a surface of the underlying layer; a gate insulating film provided on a first region in a flat surface of the semiconductor layer; a gate electrode provided on a surface of the gate insulating film; a side wall provided on second and third regions adjacent to the first region in the flat surface of the semiconductor layer, covering side surfaces of the gate insulating film and side surfaces of the gate electrode; a first insulating film provided on fourth and fifth regions adjacent to the second and third regions, respectively, in the flat surface of the semiconductor layer, on surfaces of the side walls and on a surface of the gate electrode; a second insulating film provided on a surface of the first insulating film, being different in material from the first insulating film; a first impurity layer of the first conductivity type extending from a center portion of the first region to the inside of the semiconductor layer; a second impurity layer of the second conductivity type adjacent to the first impurity layer, extending from one of peripheral portions of the first region, the second region, the fourth region, a sixth region externally adjacent to the fourth region to the inside of the semiconductor layer; a third impurity layer of the second conductivity type adjacent to the first impurity layer, extending from the other of the peripheral portions of the first region, the third region, the fifth region, a seventh region externally adjacent to the fifth region to the inside of the semiconductor layer; a first silicide layer provided on the sixth region and inside the second impurity layer located immediately below the sixth region, of which a bottom surface is located inside the second impurity layer; and a second silicide layer provided on the seventh region and inside the third impurity layer located immediately below the seventh region, of which a bottom surface is located inside the third impurity layer.

According to a second aspect of the present invention, the semiconductor device of the first aspect further comprises: a third insulating film provided on a surface of the second insulating film.

According to a third aspect of the present invention, in the semiconductor device of the second aspect, the first insulating film and the third insulating film are of the same material.

According to a fourth aspect of the present invention, in the semiconductor device of the first aspect, the first insulating film is an $SiO_2$ film.

According to a fifth aspect of the present invention, in the semiconductor device of the first aspect, the first insulating film is an $Si_3N_4$ film.

According to a sixth aspect of the present invention, the semiconductor device comprises: a semiconductor layer; a gate insulating film formed on a surface of the semiconductor layer; a gate electrode formed on a surface of the gate insulating film; a side wall formed on the surface of the semiconductor layer to cover side surfaces of the gate insulating film and side surfaces of the gate electrode; and first and second insulating layers formed on the surface of the semiconductor layer in this order by dry etching to cover surfaces of the side walls and a surface of the gate electrode, and in the semiconductor device, an etching rate of the second insulating layer is set larger than that of the first insulating layer in the dry etching.

According to a seventh aspect of the present invention, in the semiconductor device of the sixth aspect, a portion of the first insulating layer uncovered with the second insulating layer after the dry etching is removed by wet etching.

According to an eighth aspect of the present invention, in the semiconductor device of the seventh aspect, the first insulating layer comprises first and second insulating films of different materials, and the etching rate of the second insulating layer is set larger than that of the second insulating film adjacent to the second insulating layer.

The present invention is also directed to a method for manufacturing a semiconductor device. According to a ninth aspect of the present invention, the method comprises the steps of: (a) providing a semiconductor layer, a gate insulating film formed on a surface of the semiconductor layer, a gate electrode formed on a surface of the gate insulating film, a side wall formed on the surface of the semiconductor layer to cover side surfaces of the gate insulating film and side surfaces of the gate electrode; (b) forming a first insulating layer on surfaces of the side wall, a surface of the gate electrode and an exposed portion of the surface of the semiconductor layer; (c) forming a second insulating layer on a surface of the first insulating layer; (d) forming a resist layer on a surface of the second insulating layer and patterning the resist layer so as to be located above a surface region within a predetermined range surrounding a region in which the side wall is provided in the surface of the semiconductor layer; (e) etching the second and first insulating layers by dry etching with an etching rate of the second insulating layer set larger than that of the first insulating layer; (f) removing an exposed portion of the first insulating layer uncovered with the second insulating layer after the dry etching by wet etching; and (g) removing the resist layer.

According to a tenth aspect of the present invention, in the method of the ninth aspect, the first insulating layer comprises a first insulating film and a second insulating film, the etching rate of the second insulating layer is set larger than that of the second insulating film, the step (b) comprises the steps of (b-1) forming the first insulating film equivalent in material to the second insulating layer on the surface of the semiconductor layer; and (b-2) forming the second insulating film different in material from the second insulating layer on a surface of the first insulating film, and the step (f) comprises the steps of (f-1) removing an exposed portion of the second insulating film after the dry etching by a first wet etching; and (f-2) removing an exposed portion of the first insulating film after the first wet etching by a second wet etching.

According to an eleventh aspect of the present invention, in the method of the tenth aspect, the second insulating film is an $SiO_2$ film.

According to a twelfth aspect of the present invention, in the method of the tenth aspect, the second insulating film is an $Si_3N_4$ film.

According to the present invention, the semiconductor device, which has a silicide protection portion covering a gate insulating film, a gate electrode and a side wall covering the side surfaces of the gate insulating film and the gate electrode, has a characteristic feature that the silicide protection portion is of layered structure, consisting essentially of a plurality of insulating films.

In the semiconductor device of the first to fifth aspects, since a plurality of insulating films are sequentially provided on the semiconductor layer, the surface of the semiconductor layer has no level difference and is flat, and the film thickness of the semiconductor layer is uniform from the first region to the sixth region. Therefore, the bottom surface of the silicide layer provided on the sixth region and in the second impurity layer never reaches the underlying layer and the problems such as the generation of leakage current and the removal of silicide film never arise.

The semiconductor device of the fourth or fifth aspect has an advantage of using a flexible and practicable insulating film, such as an $SiO_2$ film or an $Si_3N_4$ film, as a base.

In the semiconductor device of the sixth aspect, since such a selection ratio as (the etching rate of the second insulating layer)>(the etching rate of the first insulating layer) is used in the dry etching, the portion of the second insulating layer to be etched is removed and then the etching is stopped at the surface of the first insulating layer. Specifically, the first insulating layer can be used as an etching stopper layer and it is possible to prevent the surface of the semiconductor layer from being etched by dry etching in forming the first and second insulating layers.

In the semiconductor device of the seventh aspect, since only the portion of the first insulating layer uncovered with the second insulating layer is removed by wet etching, a structure where the first insulating layer is formed on the surface of the semiconductor layer and the second insulating layer is formed on the surface of first insulating layer is obtained. Therefore, the exposed surface of the semiconductor layer after the wet etching is not etched and a flat surface of the semiconductor layer can be obtained. That makes it possible, for example, to form the silicide layer only on the surface of the semiconductor layer and inside the semiconductor layer when the silicide layer is formed in the semiconductor device.

In the semiconductor device of the eighth aspect, an etching stopper layer of triple-layered structure is achieved.

By the method of the ninth to eleventh aspects, (i) since the first insulating layer can work as the stopper layer for the dry etching, it is possible to prevent the surface of the semiconductor layer from being etched in the dry etching step, and (ii) since the exposed portion of the first insulating layer after the step (e) is removed by wet etching, a flat surface of the semiconductor layer that has never been etched through the process can be eventually obtained. Since the silicide layer can be thereby formed only inside the semiconductor layer without coming into contact with the interface when the silicide layer is further formed in the semiconductor device, the problems such as the generation of leakage current and the removal of silicide film never arise.

The method of the tenth aspect has an advantage that the second insulating film far away from the surface of the semiconductor layer can work as the stopper layer for dry etching.

Since the method of eleventh and twelfth aspects use the $SiO_2$ film and the $Si_3N_4$ film as a base, it is possible to provide a flexible and practicable manufacturing technique.

In present invention, since the silicide protection causes no difference in level to be created in the surface of the semiconductor, a flat surface of the semiconductor layer can be obtained and a god silicide layer can be obtained.

An object of the present invention is to provide a semiconductor device in which a surface region of a semiconductor layer for forming a silicide layer and that for forming a silicide protection portion are even as one surface, and to provide a method for manufacturing the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
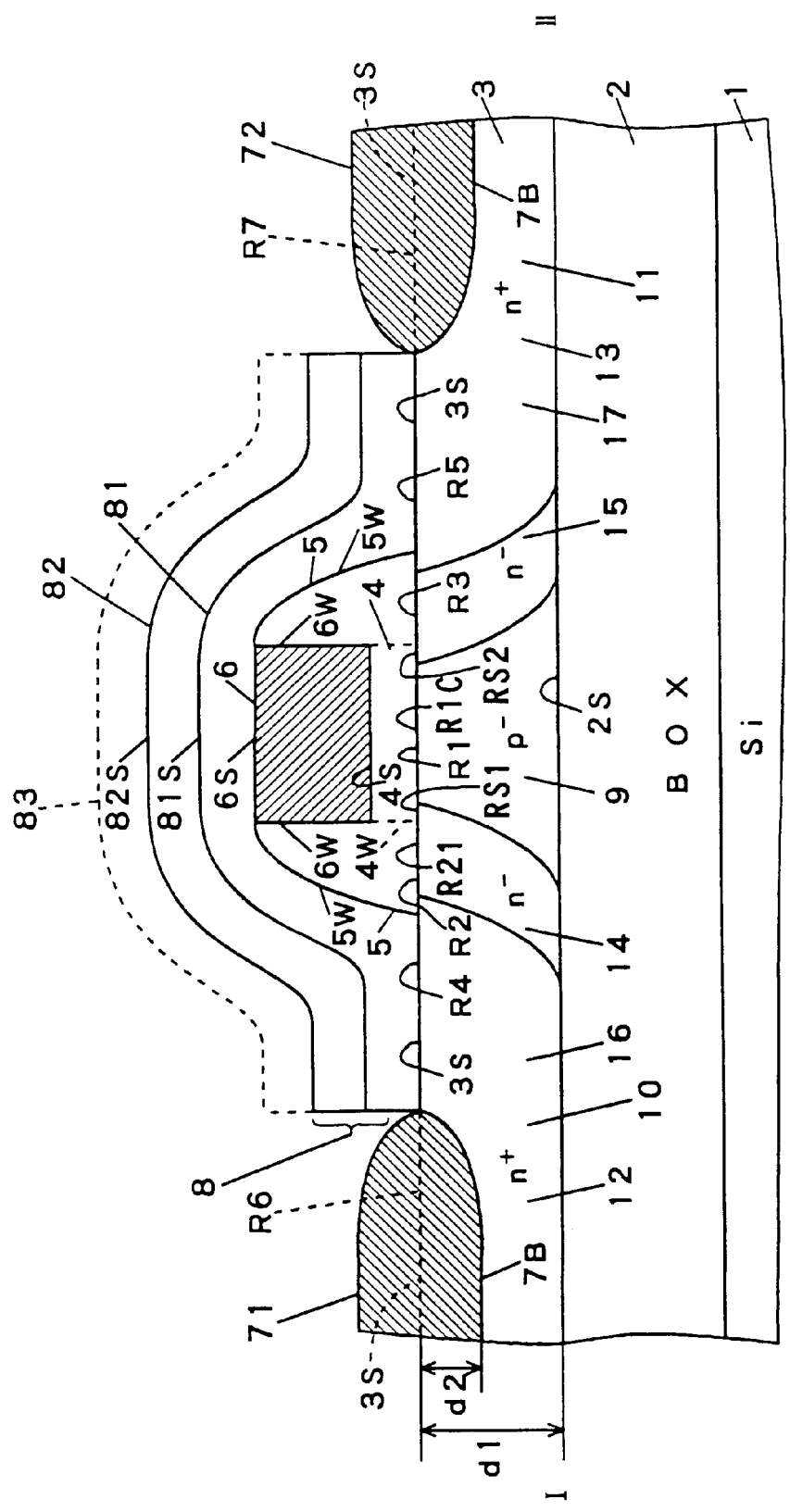
FIG. 1 is a cross section showing a semiconductor in accordance with a first preferred embodiment of the present invention.
Figure 2A:
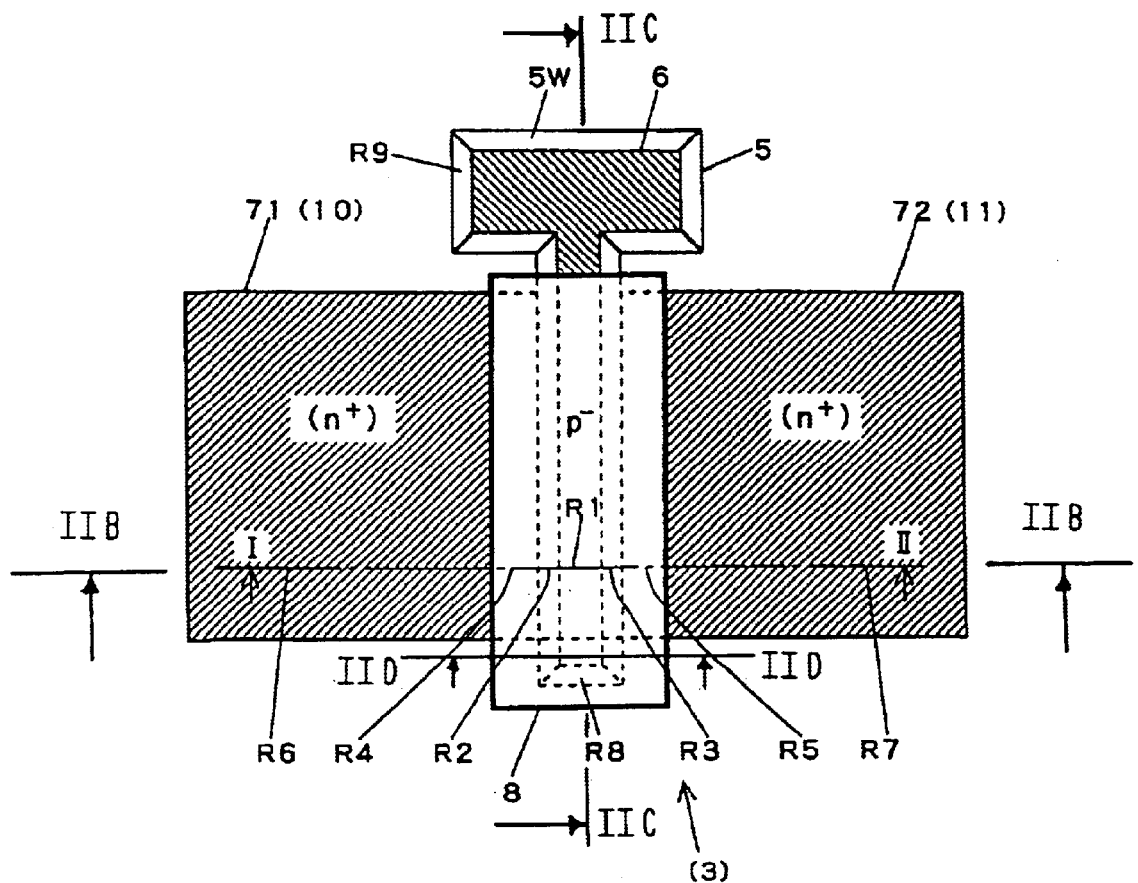
FIG. 2A is a plan view showing a semiconductor in accordance with the preferred embodiment of the present invention.
Figure 2B:
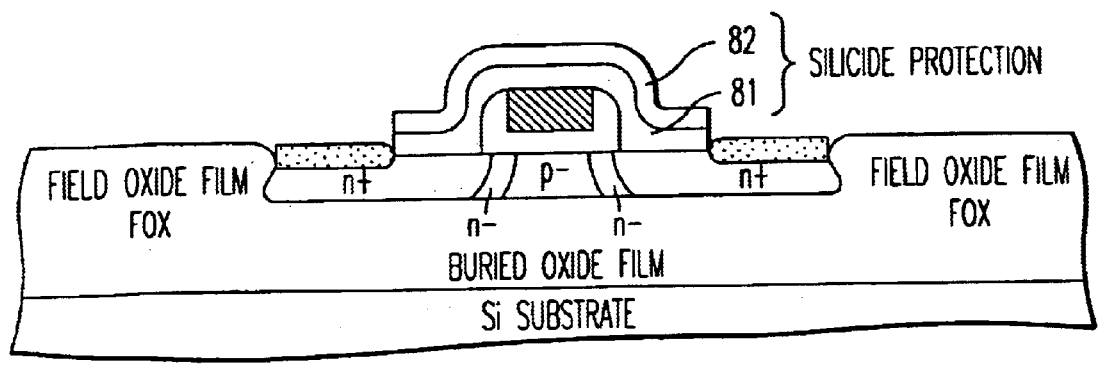
FIGS. 2B–2D are cross-sectional views of the device shown in FIG. 2A.
Figure 2C:
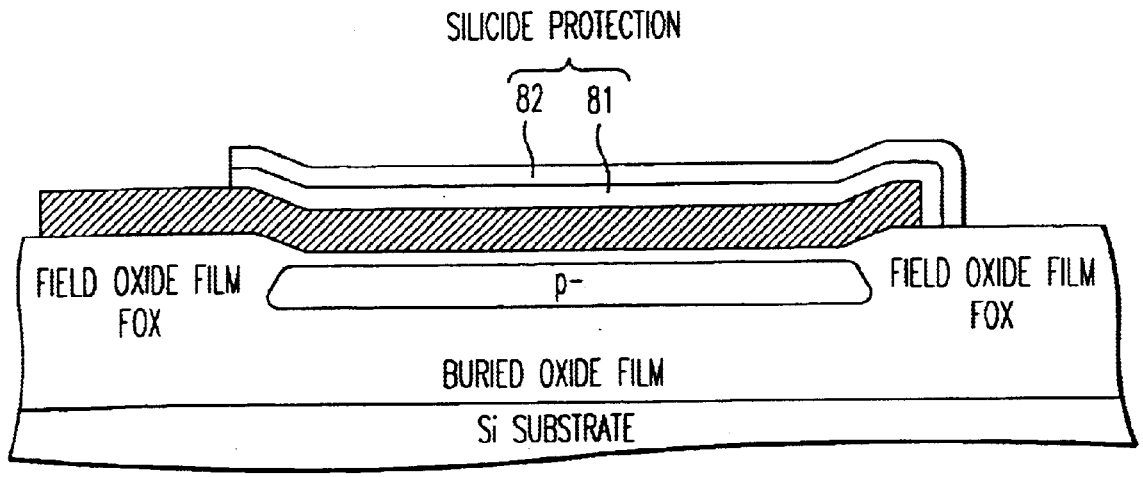
Figure 2D:
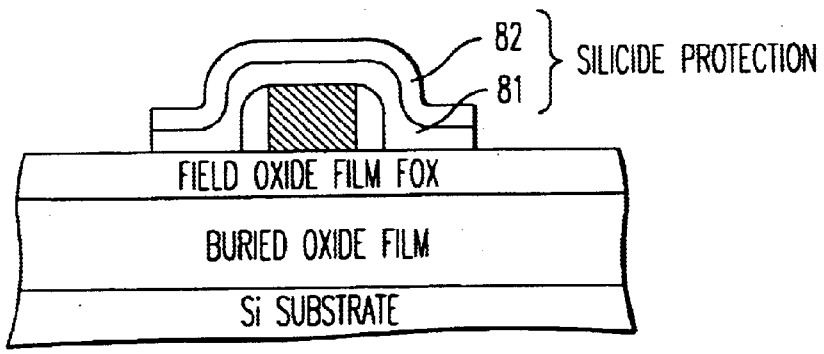

FIG. 1 is a cross section showing a structure of a MOSFET on an SOI layer which is an exemplary semiconductor device in accordance with the present invention, and FIG. 2A is a plan view of the MOSFET of FIG. 1. As understood from FIGS. 1 and 2A, FIG. 1 is a cross section taken along the line I–II of FIG. 2A. FIGS. 2B–2D are cross sectional views of the device shown in FIG. 2A, drawn through respective lines IIB—IIB, IIC—IIC, and IID—IID.

FIGS. 1 and 2A show an Si single crystal wafer 1, an underlying layer 2 which is a buried oxide film (BOX) and an SOI (Silicon On Insulator) layer or semiconductor layer 3 provided on a surface 2S of the underlying layer 2. Thus, in the first preferred embodiment, the SOI layer 3 is formed by SIMOX. Specifically, atoms of oxygen are injected into the Si single crystal wafer from its surface and the wafer is thereafter annealed at a constant temperature to diffuse the injected atoms of oxygen inside the wafer from its surface and the vicinity, thereby forming the $SiO_2$ film having a thickness of several thousand Å inside the wafer. As a result, the SOI layer 3 as the semiconductor layer having a thickness of about 1000 Å is formed between the surface 2S of the buried oxide film 2 and a surface 3S of the Si single crystal wafer 1.

On the flat surface 3S of the SOI layer 3 and inside the SOI layer 3, the MOSFET is provided. Specifically, a gate insulating film 4 is formed on a first region R1 (a center portion R1C, other than peripheral portions, which occupies most of the region R1, corresponds to a surface region of a $p^-$ layer 9 discussed later) in the uniformly flat surface 3S, and further, a gate electrode or a control electrode 6 of polysilicon and the like is formed on a surface 4S of the film 4. A side wall 5 is so formed as to cover side surfaces 6W of the gate electrode 6 and side surfaces 4W of the gate insulating film 4 on a second region R2 and a third region R3 adjacent to the first region R1 inside the flat surface 3S and on regions R8 and R9 where no $p^-$ layer 9 is formed shown in FIG. 2A. Further, the first impurity layer 9 ($p^-$ layer) having first impurities of the first conductivity type (p type) at relatively low concentration is formed inside the SOI layer 3, extending from the center portion R1C of the first region R1 in the flat surface 3S to the second surface 2S of the buried oxide film 2 immediately therebelow. A second impurity layer 10 (e.g., source region) having second impurities of the second conductive type (n type) is so formed as to be adjacent to the first impurity layer 9, extending from the regions in the flat surface 3S, specifically one of peripheral portions RS1 of the first region R1 adjacent to the center portion R1C, the second region R2, a fourth region R4 externally adjacent to the second region R2 and a sixth region R6 externally adjacent to the fourth region R4, to the surface 2S of the buried oxide film 2.

The second impurity layer 10 consists of ① an $n^-$ layer 14 having the second impurities at relatively low concentration, extending from the above one peripheral portion RS1 of the first region R1 and a portion R21 of the second region R2 having an interface with the side wall 5 to the inside of the layer 10 and ② an $n^+$ layer 12 having the second impurities at relatively high concentration, extending from the remainder of the second region R2 (externally adjacent to the portion R21) and the fourth region R4 in the flat surface 3S adjacent to the remainder of the region R2 to the inside of the layer 10. Further, a third impurity layer (e.g., drain region) having the second impurities of the second conductivity type is so formed as to sandwich the first impurity layer 9 with the second impurity layer 10, extending from the regions in the flat surface 3S, specifically the other peripheral portion RS2 of the first region R1 adjacent to the center portion R1C, the third region R3, a fifth region R5 externally adjacent to the region R3 and a seventh region R7 externally adjacent to the fifth region R5, to the surface 2S of the buried oxide film 2.

A silicide protection portion 8 consisting of a plurality of layers is so layered on the flat surface 3S as to cover the gate electrode 6 and the side wall 5. Specifically, a first insulating film 81 is formed on the fourth region R4 and the fifth region R5 in the flat surface 3S having no difference in level, surfaces 5W of the side wall 4 and a surface 6S of the gate electrode 6, and a second insulating film 82 different in material from the film 81 is so formed on a surface 81S of the film 81 as to cover the surface 81S. The films 81 and 82 are made of different materials. The silicide protection portion 8 has the layered structure consisting of a plurality of insulating films and covers the regions R1 to R5 in the flat surface 3S which are not covered with a silicide layer discussed later. The portion 8 does not reach high-resistance portions 16 and 17 immediately below the regions R4 and R5 of the $n^+$ layers 12 and 13 in the second and third impurity layers 10 and 11. Therefore, the high-resistance portions 16 and 17 of the $n^+$ layers 12 and 13 each have the same thickness as the layers 9, 14 and 15 in the SOI layer 3. The thickness is represented as d1 in FIG. 1.

A first silicide layer 71 which is a silicified $n^+$ layer is formed on the sixth region R6 in the flat surface 3S and in the $n^+$ layer 12 of the second impurity layer 10 to a depth of d2 (<d1) from the region R6. A second silicide layer 72 which is a silicified $n^+$ layer is formed on the seventh region R7 in the flat surface 3S and in the $n^+$ layer 13 to the depth of d2 from the region R7. Thus, bottom surfaces 7B of the first and second silicide layers 71 and 72 are located in the n+ layers 12 and 13 without coming into contact with the surface 2S, and the first and second silicide layers 71 and 72 serve as respective low-resistance portions (the sheet resistance is e.g., 10 Ω/□) of the second and third impurity layers. The sheet resistance of high-resistance portion in the n+ layer 12 and 13 where no silicide layer 71 or 72 is formed is e.g., 100 Ω/□. In the semiconductor device of this preferred embodiment, no portion in the SOI layer 3 is ever etched and the SOI layer 3 has a uniform thickness d1. And the silicide layers 71 and 72 do not reach the interface (surface 2S) between the SOI layer 3 and the underlaying layer 2. Therefore, the problems in the prior art, such as the generation of leakage current and the removal of silicide film are not caused at all.

Further, as indicated by a broken line in FIG. 1, an insulating film equivalent in quality to the first insulating film 81 may be formed as a third insulating film 83 on a surface 82S of the second insulating film 82. Furthermore, more insulating films, e.g., a fourth insulating film, a fifth insulating film and so on, may be used to constitute the silicide protection portion 8 of a plurality of films. These structures can produce the same advantages as that of FIG. 1.

The above-discussed structure of the semiconductor device of this preferred embodiment, especially the structure of the silicide protection portion 8, can be specified as below from the viewpoint of manufacturing process. Specifically, the first and second insulating films 81 and 82 of FIG. 1 are formed in this order as first and second insulating layers to cover the surfaces 5S of the side wall 5, the surface 6S of the gate electrode 6 and the uncovered flat surface 3S. Further, the second insulating layer is first anisotropically etched by dry etching and the etched second insulating layer covers the surfaces 5S and 6S and the regions R4 and R5. After that, a wet etching is performed on a range from an exposed surface of the first insulting film through the first insulating layer immediately therebelow to remove the portion. The films 81 and 82 finally have the above-formed structure. In the above dry etching, a selection ratio of the etching rates of the first and second insulating films is so set as to hold such a relation as (the etching rate of the second insulating film)>(the etching rate of the first insulating film). With this setting, the dry etching is stopped at the surface of the first insulating layer and the flat surface 3S is not dry-etched at all, keeping the flatness as it was before the dry etching also after the dry etching and the following wet etching.

Further, if the third insulating film 83 of FIG. 1 is formed, it is necessary to set the selection ratio, by appropriately choosing the etchant, so as to hold such a relation as (the etching rate of the third insulating film 83)>(the etching rate of the second insulating film 82). In this sense, it may be considered that the third insulating film 83 acts as "the second insulating layer" and a combination unit of the second and first insulating films 82 and 81 act as "the first insulating layer".

As the first and third insulating films 81 and 83 of FIG. 1, an SiO$_2$ film, for example, having flexibility may be used. In this case, as the second insulating film 82, an SiN film, a polysilicon film undoped with impurity or other insulating film may be used.

Conversely, when an Si$_3$N$_4$ film which also has flexibility is used as the first and third insulating films 81 and 83, an SiO$_2$ film, a polysilicon film undoped with impurity or other insulating film may be used.

Specific examples will be discussed below.

Figure 3:
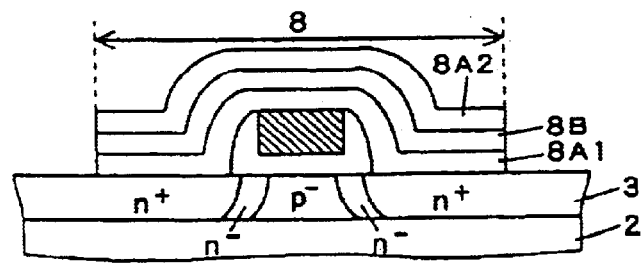
FIGS. 3 and 4 are cross sections showing a first example.

In a structure of the silicide protection portion 8 of FIG. 3, an Si$_3$N$_4$ film 8B is inserted into the SiO$_2$ film which corresponds to the prior-art silicide protection portion, being sandwiched by SiO$_2$ films 8A1 and 8A2.

Figure 4:
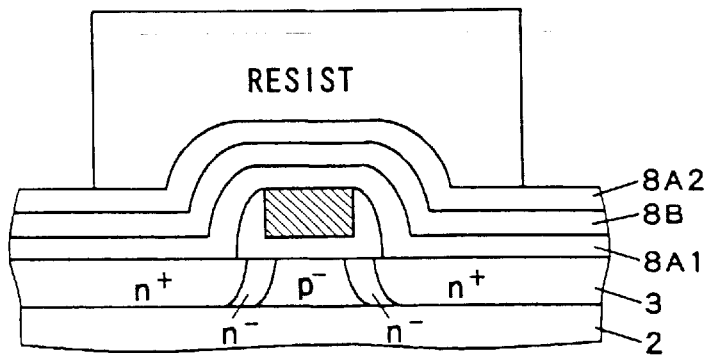

Such a structure can be achieved by setting the selection ratio of the SiO$_2$ film 8A2 and the Si$_3$N$_4$ film 8B as follows in the dry etching for the silicide protection portion 8 of layered structure of FIG. 4. Specifically, when the etching rate of the Si$_3$N$_4$ film 8B is set smaller than that of the SiO$_2$ film 8A2 in the dry etching, the anisotropic etching is performed on the SiO$_2$ film 8A2 and then stopped at a surface of the Si$_3$N$_4$ film 8B. After that, an exposed portion of the Si$_3$N$_4$ film 8B other than a portion to form the silicide protection portion 8 is removed by wet etching with thermal phosphoric acid and a portion of the SiO$_2$ film 8A1 immediately therebelow is removed by wet etching, to form the silicide protection portion 8.

Each thickness of the SiO$_2$ films 8A1 and 8A2 and the Si$_3$N$_4$ film 8B is in a range of several hundred Å to several thousand Å.

Figure 5:
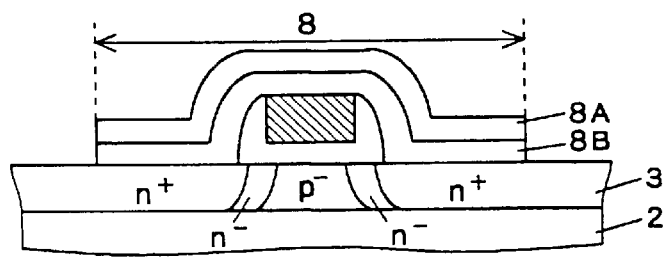
FIGS. 5 and 6 are cross sections showing a second example.

In the silicide protection portion 8 of FIG. 5, the Si$_3$N$_4$ film 8B is provided as the first insulating film and the SiO$_2$ film 8A is provided thereon as the second insulating film.

Figure 6:
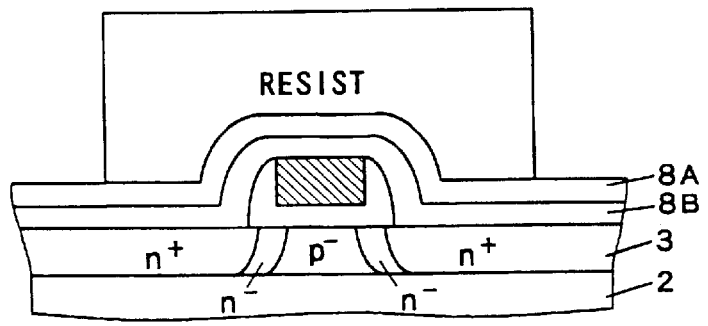

To achieve such a double-layered structure, a dry etching is performed on the SiO$_2$ film 8A with the etching rate of the Si$_3$N$_4$ film 8B of FIG. 6 set smaller than that of the SiO$_2$ film 8A, line the example 1. After removing a portion of the SiO$_2$ film not to form the silicide protection portion 8 by anisotropic etching, the dry etching is stopped at the surface of an exposed surface of the Si$_3$N$_4$ film 8B and a portion of the Si$_3$N$_4$ film 8B other than the silicide protection portion 8 is removed by wet etching with thermal phosphoric acid. Thus, the silicide protection portion 8 of FIG. 5 is formed.

Each thickness of the SiO$_2$ film 8A and the Si$_3$N$_4$ film 8B is in a range of several hundred Å to several thousand Å.

Figure 7:
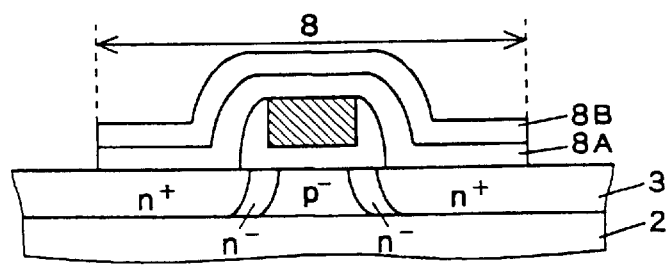
FIGS. 7 and 8 are cross sections showing a third example.

In a structure of the silicide protection portion 8 of FIG. 7, the SiO$_2$ film 8A is provided as the first insulating film under the Si$_3$N$_4$ film 8B as the second insulating film.

Figure 8:
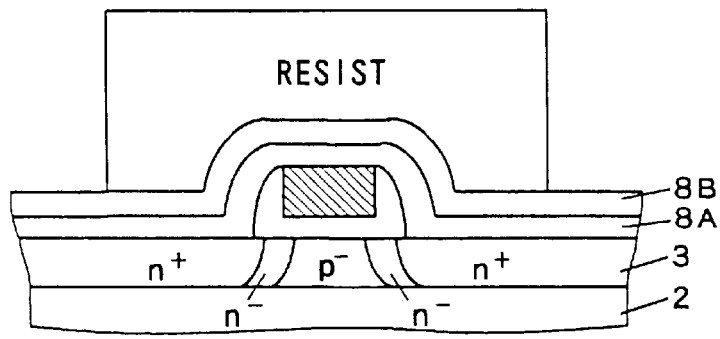

In the example 3, contrary to the examples 1 and 2, the etching rate of the SiO$_2$ film 8A is set smaller than that of the Si$_3$N$_4$ film 8B, and the SiO$_2$ film 8A and the Si$_3$N$_4$ film 8B which are layered in the order of FIG. 8 are dry-etched. The dry etching is thereby stopped at the surface of the SiO$_2$ film 8A, and a portion of the SiO$_2$ film 8A other than the silicide protection portion 8 is removed by wet etching, to form the silicide protection portion 8 of FIG. 7.

Each thickness of a lower layer, the SiO$_2$ film 8A, and an upper layer, the SiN film 8B, is in a range of several hundred Å to several thousand Å.

Figure 9:
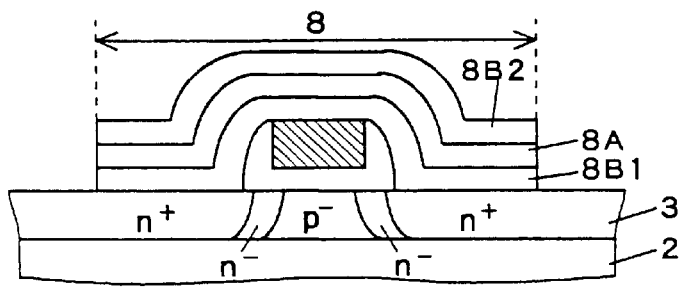
FIGS. 9 and 10 are cross sections showing a fourth example.

In a structure of the silicide protection portion 8 of FIG. 9, contrary to the example 1, the Si$_3$N$_4$ film 8B1 as the first insulating film and the Si$_3$N$_4$ film 8B2 as the third insulating film sandwich the SiO$_2$ film 8A as the second insulating film. It may be considered in this structure that the SiN film 8B2 acting as the second insulating layer is formed on a combination unit of the Si$_3$N$_4$ film 8B1 and the SiO$_2$ film 8A acting as the first insulating layer.

Figure 10:
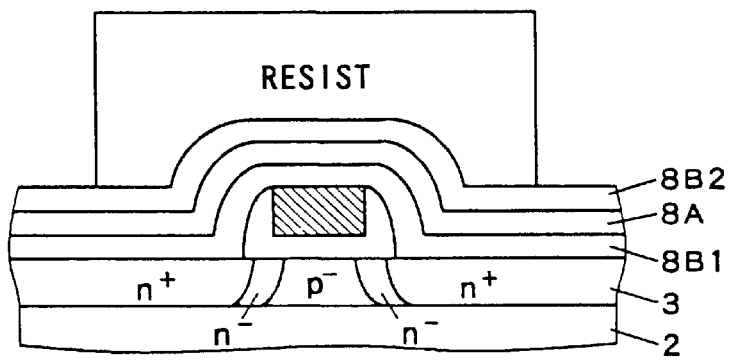

In this example, the selection ratio of the Si$_3$N$_4$ film 8B2 and the SiO$_2$ film 8A is so set as to hold such a relation as (the etching rate of the film 8B2)>(the etching rate of the film 8A), to control an for a source/drain region (see FIG. 10).

Each thickness of the SiO$_2$ film 8A and the Si$_3$N$_4$ films 8B1 and 8B2 is in a range of several hundred Å to several thousand Å.

The Second Preferred Embodiment

An exemplary method for manufacturing a semiconductor device (MOSFET) having the silicide protection portion as discussed in the first preferred embodiment will be discussed with reference to the cross sections of FIGS. 11 to 24.

(Preparation Step a)

Figure 11:
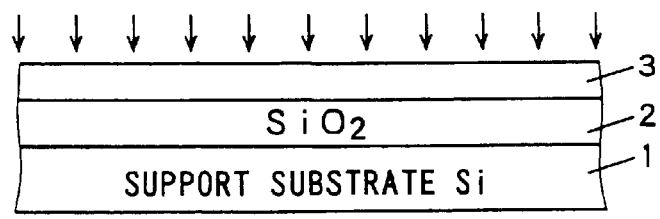
FIGS. 11 to 28 are cross sections showing steps for manufacturing a semiconductor device in accordance with a second preferred embodiment of the present invention.

FIG. 11 shows a step of injecting a channel doping ion.

First, the silicon single crystal wafer 1 is prepared as a support substrate, an SiO$_2$ film 2 having a thickness of about 4000 Å is formed by the above-mentioned SIMOX in the silicon wafer 1 as the buried oxide film (underlying layer) and then the SOI layer 3 having a thickness of about 1000 Å is formed.

After that, through the injection step of FIG. 11, the first impurity layer having the first impurities of the first conductivity type is formed in the SOI layer 3. What is used as the first impurity and its injection concentration depend on whether an nMOSFET or a pMOSFET is to be formed. Specifically, in a case of formation of an nMOSFET, a p-type impurity is used as the first impurity of the first conductivity type to be injected, and the SOI layer 3 is implanted with, for example, arsenic having a concentration of about 4E13 cm$^{-2}$ as the first impurity at an acceleration energy of 60 keV. On the other hand, in a case of information of a pMOSFET, an n-type impurity is used as the second impurity of the second conductivity type, and the SOI layer 3 is implanted with, for example, boron having a concentration of about 4E13 cm$^{-2}$ at an acceleration energy of 10 keV.

Figure 12:
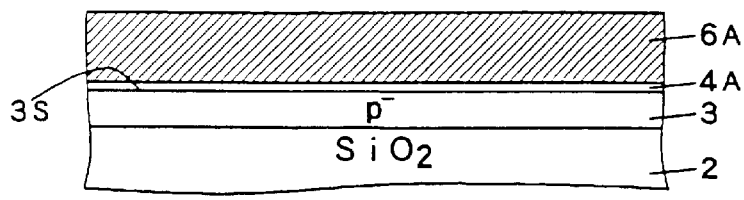

FIG. 12 shows a step of depositing a gate oxide film (gate insulating film) and a polysilicon film for gate electrode. In this step, a gate oxide film 4A having a thickness of about 70 Å and a polysilicon film 6A having a thickness of about 2000 Å are layered in this order on the flat surface 3S of the SOI layer 3.

Figure 13:
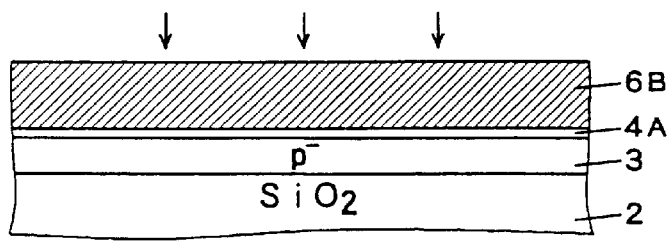

FIG. 13 shows a step of injecting doping ions to form a gate electrode. Through this step, the polysilicon film 6A of FIG. 12 becomes a conductive polysilicon film 6B. In a case of nMOSFET, the film 6A is implanted with phosphorus having a concentration of about 5E15 cm$^{-2}$ at an acceleration energy of 15 keV. On the other hand, in a case of pMOSFET, the film 6A is implanted with boron having a concentration of about 5E15 cm$^{-2}$ at an acceleration energy of 10 keV.

Figure 14:
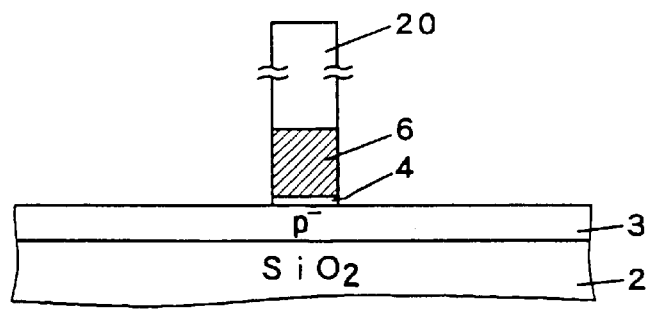

FIG. 14 shows a step of dry etching for gate patterning. Specifically, a resist pattern 20 is formed in accordance with the gate pattern and a dry etching is performed with this pattern 20 as a mask, to form the gate oxide film 4 as the gate insulating film and the polysilicon film 6 as the gate electrode as shown in FIG. 14.

Figure 15:
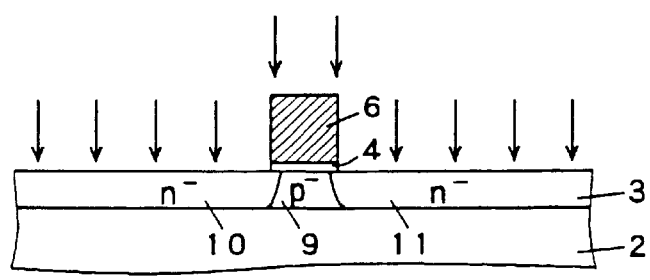

FIG. 15 shows a step of removing the resist pattern 20 of FIG. 14 and injecting impurity ions for the source/drain.

As the second impurity of the second conductivity type, an n-type impurity (e.g., arsenic: 60 keV, about 4E13 cm$^{-2}$) is used in an nMOSFET, and a p-type impurity (e.g., boron: 10 keV, about 4E13 cm$^{-2}$) is used in a pMOSFET.

Figure 16:
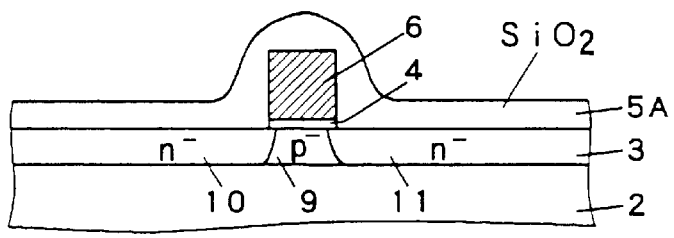

FIG. 16 shows a step of depositing a SiO$_2$ film 5A for the side wall.

In this step, the SiO$_2$ film 5A having a thickness of 800 Å is formed on the flat surface 3S of the SOI layer 3, side surfaces of the gate oxide film 4 and surfaces of the polysilicon film 6 for the gate electrode.

Figure 17:
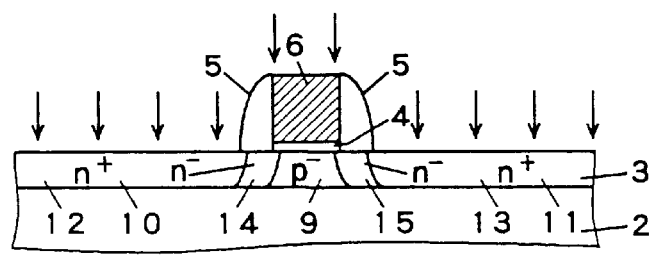

FIG. 17 shows the second injection step of impurity ions for the source/drain after the dry etching for the SiO$_2$ film 5A for the side wall. Specifically, the SiO$_2$ film 5A of FIG. 16 is dry-etched to form the side wall 5 for covering both side surfaces of the gate insulating film 4 and the gate electrode 6 and after that, the second impurities (ions) of the second conductivity type are injected into the source/drain regions. For example, in the case of the nMOSFET shown in FIG. 17, arsenic ions having a concentration of about 4E15 cm$^{-2}$ are injected at an acceleration energy of 60 keV. On the other hand, in the case of a pMOSFET (not shown), boron ions having a concentration of about 4E15 cm$^{-2}$ are injected at an acceleration energy of 10 keV. By this injection, portions uncovered with the side wall 5 in the second and third impurity layers serving as the source/drain regions become highly-concentrated impurity layers (n$^+$).

(The First Insulating Layer Formation Step b)

Figure 18:
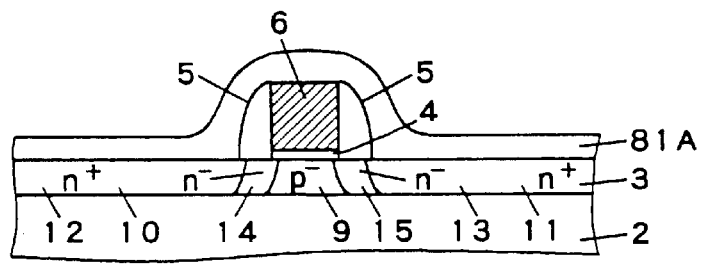

FIG. 18 shows a state where the first insulating layer 81A is formed.

Specifically, the first insulating layer 81A is formed on the surfaces of the side wall 5, the surface of the gate electrode 6, and an exposed portion of the flat surface 3S of the SOI layer 3 uncovered with the side wall 5. The layer 81A is an SiO$_2$ film or an Si$_3$N$_4$ film. If the Si$_3$N$_4$ film is used, the Si$_3$N$_4$ film must have a thickness of 3000 Å or less, lest an stress between the Si$_3$N$_4$ film and the SiO$_2$ film becomes large.

(The Second Insulating Layer Formation Step c)

Figure 19:
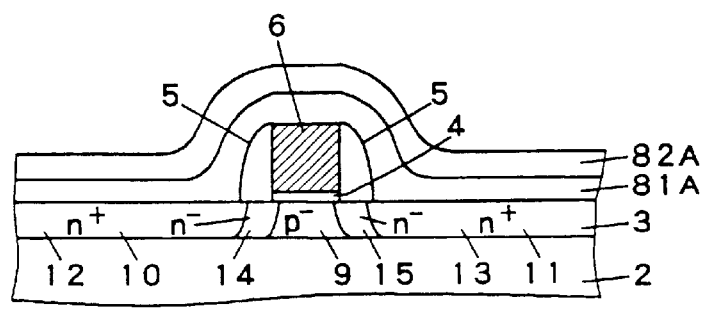

Next, as shown in FIG. 19, the second insulating layer 82A is layered on a surface of the first insulating film 81A. When an SiO$_2$ film, for example, is used as the first insulating layer 81A, an Si$_3$N$_4$ film, an undoped polysilicon film or other insulating film is used as the second insulating layer 82A. Conversely, when the Si$_3$N$_4$ film is used as the first insulating layer 81A, an SiO$_2$ film, an undoped polysilicon film or other insulating film is used as the second insulating layer 82A.

(Resist Patterning Step d)

Figure 20:
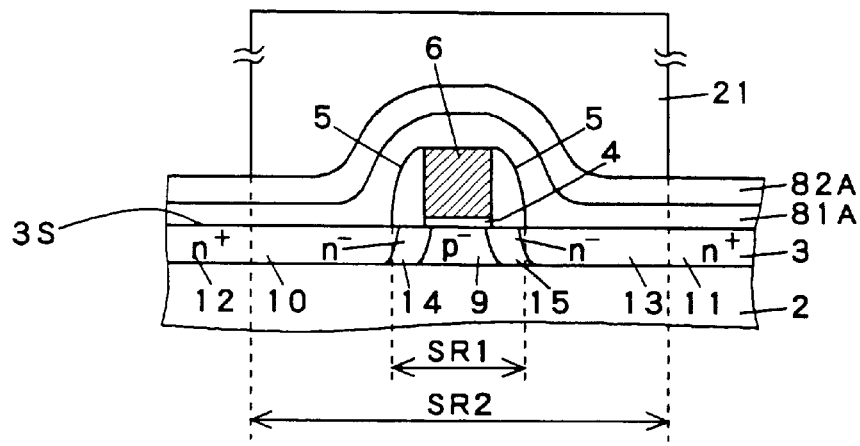

A resist layer (not shown) is formed on an entire surface of the second insulating layer 82A, and as shown in FIG. 20, the resist layer is patterned to form a resist layer 21 which is located above a portion SR1 covered with the side wall 5 and the gate insulating film 4 in the flat surface 3S of the SOI layer 3 and above a surface region SR2 within a predetermined range surrounding the portion SR1.

(Dry Etching Step e)

Figure 21:
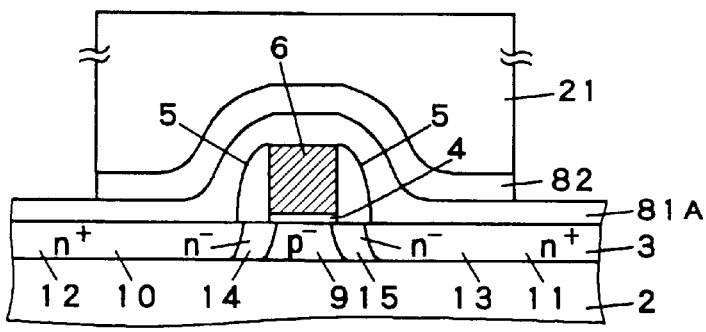

With the selection ratio so set as to satisfy such a condition as (the etching rate of the second insulating layer 82A)>(the etching rate of the first insulating layer 81A), a normal dry etching is performed. As a result, as shown in FIG. 21, a portion of the second insulating layer 82A uncovered with the resist layer 21 is removed by the dry etching and the dry etching is stopped at an exposed surface of the first insulating layer 81A. Therefore, not only the first insulating layer 81A but also the SOI layer 3 immediately therebelow is prevented from being dry-etched, and the surface 3S of the SOI layer 3 keeps flat.

(Wet Etching Step f)

Next, with thermal phosphoric acid, a wet etching is performed on an exposed portion of the first insulating layer 81A uncovered with the second insulating layer 82 after the dry etching to remove the portion. By these steps, only the first and second insulating layers 81 and 82 covered with the resist layer 21 are left on the surface 3S. Since the flat surface 3S is not wet-etched in this step, however, no difference in level is created on the flat surface 3S and no change in flatness of the surface 3S and thickness of the SOI layer 3 is made.

(Resist-Layer Removing Step g)

Figure 22:
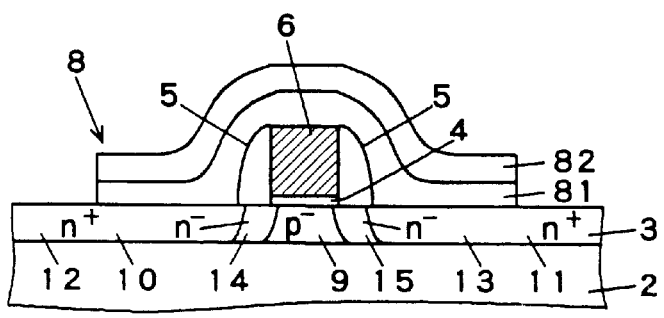

Subsequently, the resist layer 21 is removed. By this removal, the silicide protection portion 8 consisting of the first and second insulating layers 81 and 82 is formed on the flat surface 3S to cover the gate electrode 6 and the side wall 5 as shown in FIG. 22.

(Silicification Step h)

Figure 23:
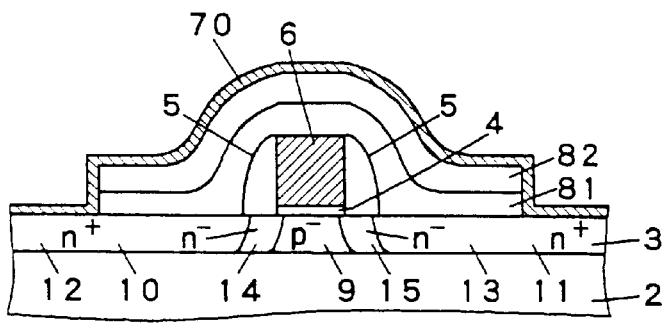
Figure 24:
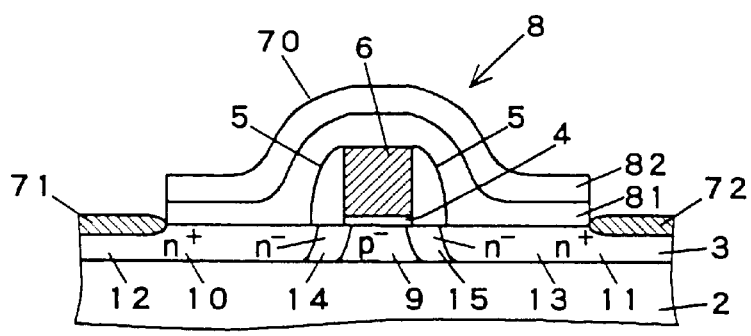

As shown in FIG. 23, cobalt is sputtered on the exposed flat surface 3S and the surface of the silicide protection portion 8, to form a cobalt layer 70 (having a thickness of 120 Å). After that, this device is annealed (lamp annealing) in $N_2$ gas at about 800° C. for thirty seconds. After annealing, Co is removed from the $SiO_2$ film by means of immersion in an acid solution. Through this step, the cobalt silicide layers 71 and 72 (having a thickness of about 500 Å) are formed in the source/drain regions 10 and 11 uncovered with the silicide protection portion 8. In this case, the source/drain regions 10 and 11 have a uniform thickness and therefore the bottom surfaces of the cobalt silicide layers 71 and 72 never penetrate the interface 2S between the SOI layer 3 and the underlying layer 2, and a structure that works well as an input/output protection circuit can be achieved in the present device.

Further, the first insulating layer 81 (81A) of FIG. 18 may be formed of at least double-layered structure. Then, discussion will be made below on a method for manufacturing the first insulating layer 81 of double-layered structure, consisting of the first insulating film 81a and the second insulating film 82a.

Figure 25:
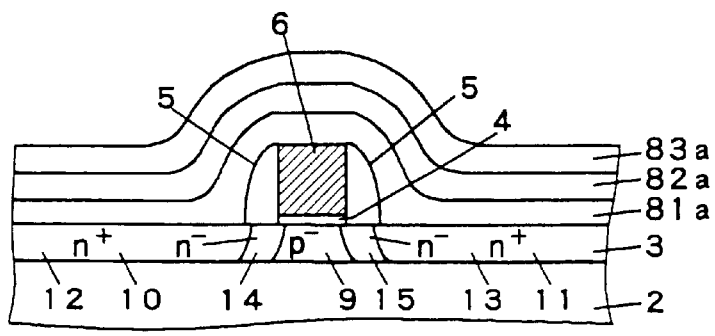

First, in this case, a step of FIG. 25 is further performed between the steps of FIGS. 18 and 19. Specifically, on a surface of the first insulating film 81a formed in the step of FIG. 18, the second insulating film 82a different in material therefrom is formed. By this formation, the first insulating layer 81 consisting of the films 81a and 82a is formed as shown in FIG. 19.

Figure 26:
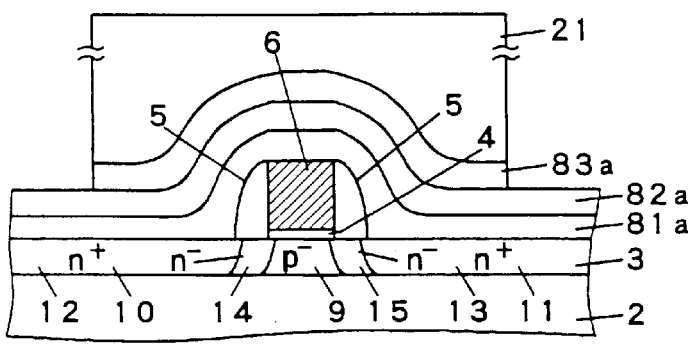
Figure 27:
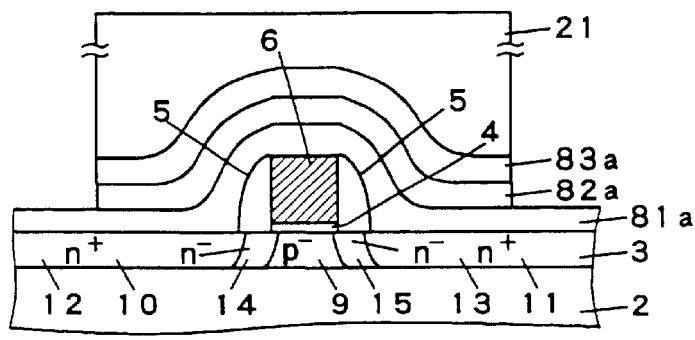
Figure 28:
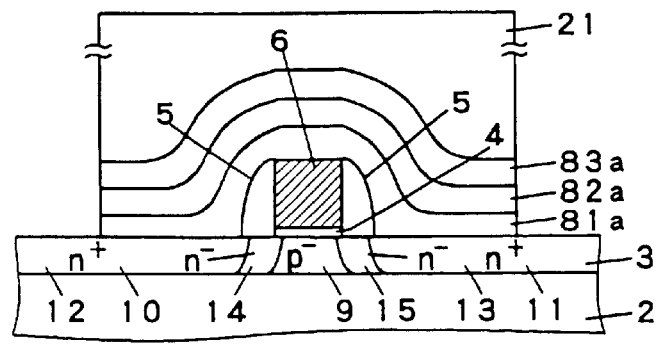
Figure 29:
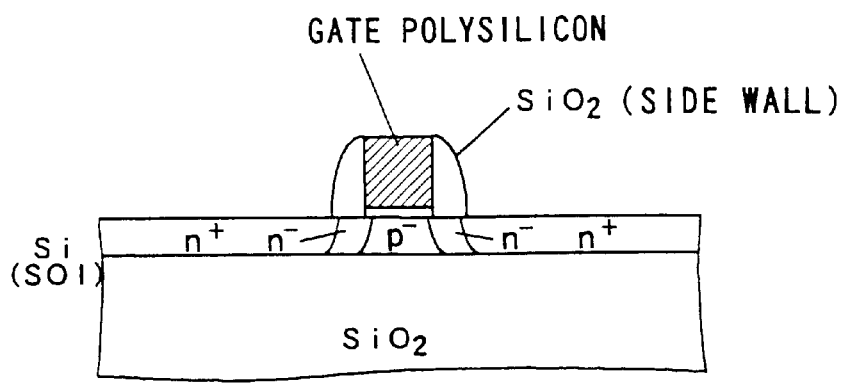
FIGS. 29 to 35 illustrate problems of the background art.
Figure 30:
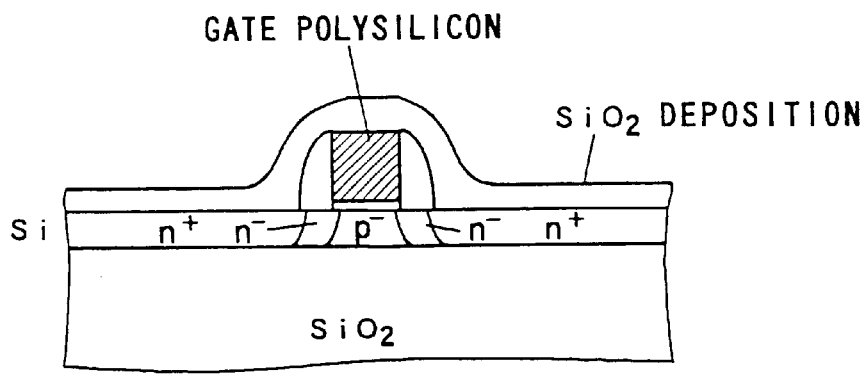
Figure 31:
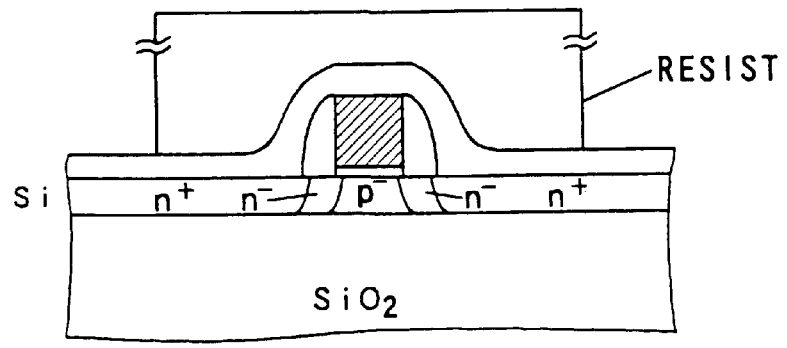
Figure 32:
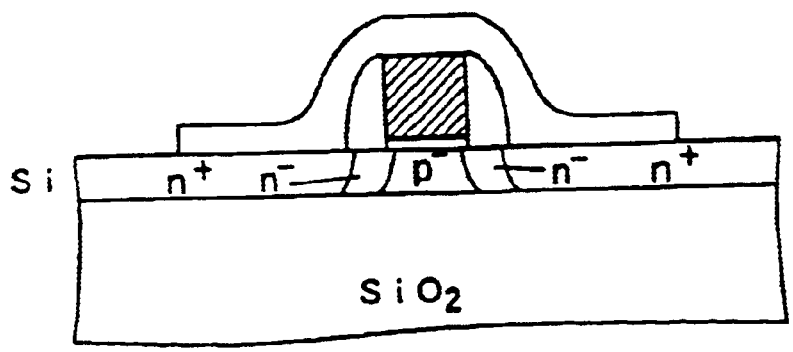
Figure 33:
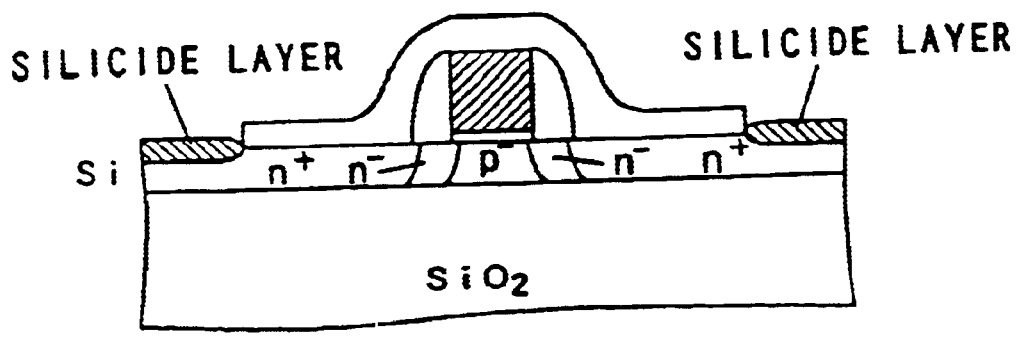
Figure 34:
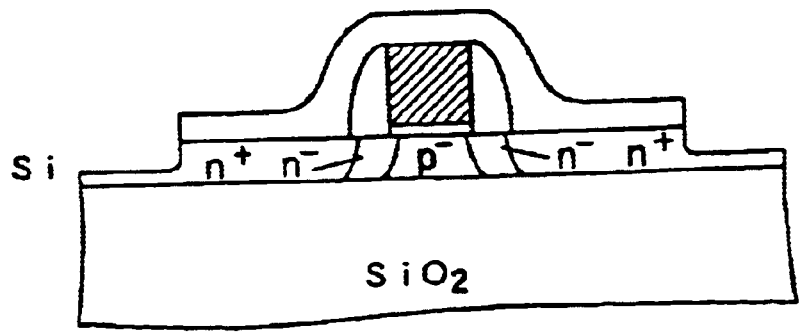
Figure 35:
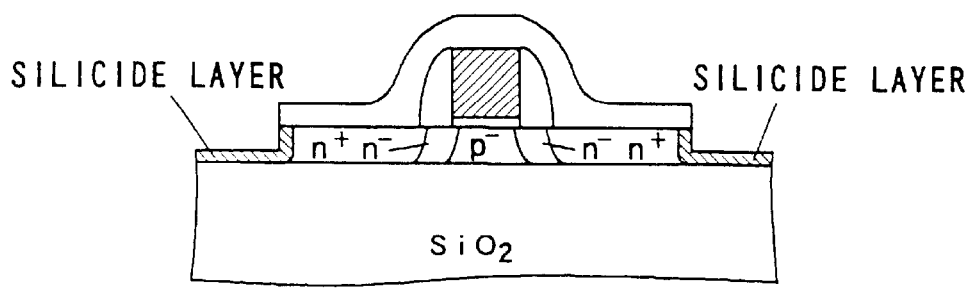

In this case, the etching steps of FIGS. 21 and 22 are amended. Specifically, in this case, the selection ratio is set so that the etching rate of the second insulating layer 82A equivalent in material to the first insulating film 81a may be larger than that of the second insulating film 82a, and with this selection ratio, the dry etching is performed. By this etching, as shown in FIG. 26, a portion of the second insulating film 82a uncovered with the resist layer 21 is exposed and the dry etching is stopped. Next, the exposed portion of the second insulating film 82a of FIG. 26 is removed by the first dry etching as shown in FIG. 27, and further the exposed portion of the first insulating film 81a of FIG. 27 is removed by the second wet etching as shown in FIG. 28. After that, by removing the resist layer 21 of FIG. 28, the silicide protection portion 8 is formed to have the first insulating layer 81 consisting of the first and second insulating films 81a and 82a shown in FIG. 22 and the second insulating layer 82 made of the third insulating film 83a shown in FIG. 22.

Also in this case, naturally, the same advantage of manufacture as the above can be produced.

(Additional Remark)

Though discussion has been made taking the case of a MOSFET using SOI in the first and second preferred embodiments, the "semiconductor layer" and the "underlying layer" of the present invention are not limited to the "SOI layer" and the "BOX layer". For example, the present invention can be also applied to a case where a p-type MOSFET or an n-type MOSFET is formed in an n well or a p well. In this case, the n well or the p well is the "underlying layer" in place of the "BOX layer", and in the well, the source and drain regions and an $n^-$ layer or a $p^-$ layer serving as a channel sandwiched by the source and drain regions constitute the "semiconductor layer".

While the invention has been shown and described in detail, the foregoing description is in all aspects illustrative and not restrictive. It is therefore understood that numerous modifications and variations can be devised without departing from the scope of the invention.

What is claimed is:

1. A method for manufacturing a semiconductor device, comprising the steps of:

(a) providing a semiconductor layer, a gate insulating film formed on a surface of said semiconductor layer, a gate electrode formed on a surface of said gate insulating film and a side wall formed on said surface of said semiconductor layer to cover side surfaces of said gate insulating film and side surfaces of said gate electrode;

(b) forming a first insulating layer on surfaces of said side wall, a surface of said gate electrode and an exposed portion of said surface of said semiconductor layer;

(c) forming a second insulating layer on a surface of said first insulating layer;

(d) forming a resist layer on a surface of said second insulating layer and patterning said resist layer so as to be located above a surface region within a predetermined range surrounding a region in which said side wall is provided in said surface of said semiconductor layer;

(e) etching said second and first insulating layers by dry etching with an etching rate of said second insulating layer set larger than that of said first insulating layer;

(f) removing an exposed portion of said first insulating layer uncovered with said second insulating layer after said dry etching by wet etching; and (g) removing said resist layer.

2. The method of claim 1, comprising:

said first insulating layer comprises a first insulating film and a second insulating film, said etching rate of said second insulating layer is set larger than that of said second insulating film, said step (b) comprises the steps of (b-1) forming said first insulating film of a material the same as that of said second insulating layer on said surface of said semiconductor layer; and (b-2) forming said second insulating film of a material different from that of said second insulating layer on a surface of said first insulating film, and said step (f) comprises the steps of (f-1) removing an exposed portion of said second insulating film after said dry etching by a first wet etching; and (f-2) removing an exposed portion of said first insulating film after said first wet etching by a second wet etching.

3. The method of claim 2, wherein said second insulating film is an $SiO_2$ film.

4. The method of claim 2, wherein said second insulating film is an SiN film.

* * * * *